(12) United States Patent
Guerra et al.

(10) Patent No.: US 8,195,104 B2
(45) Date of Patent: Jun. 5, 2012

(54) ELECTRONIC AMPLIFICATION DEVICE WITH CURRENT MIRROR FOR INTEGRATED POWER AMPLIFIERS

(75) Inventors: Ranieri Guerra, San Giovanni la Punta (IT); Giuseppe Palmisano, San Giovanni la Punta (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 260 days.

(21) Appl. No.: 12/643,373

(22) Filed: Dec. 21, 2009

(65) Prior Publication Data

US 2010/0159853 A1    Jun. 24, 2010

(30) Foreign Application Priority Data

Dec. 22, 2008 (IT) .............................. MI2008A2283

(51) Int. Cl.
*H04B 1/04* (2006.01)
(52) U.S. Cl. .................... 455/114.3; 455/91; 455/127.1; 455/127.3; 330/253; 330/310; 330/255; 330/257
(58) Field of Classification Search .................. 455/91, 455/114.3, 118, 127.1, 127.3; 330/253, 310, 330/255, 257, 258, 261, 267, 311, 277, 296, 330/299
See application file for complete search history.

(56) References Cited

U.S. PATENT DOCUMENTS

| | | | | |
|---|---|---|---|---|
| 5,029,138 A * | 7/1991 | Iwashita | ................... | 365/185.21 |
| 5,132,640 A | 7/1992 | Tanaka et al. | ................. | 330/252 |
| 5,376,897 A | 12/1994 | Yoshino et al. | ............... | 330/252 |
| 5,668,468 A | 9/1997 | Cargill | ......................... | 323/316 |
| 6,437,612 B1 * | 8/2002 | Dasgupta et al. | ............. | 327/108 |
| 2009/0019388 A1 * | 1/2009 | Zhang et al. | ................... | 715/772 |

FOREIGN PATENT DOCUMENTS

EP    1227580    7/2002

OTHER PUBLICATIONS

Choi et al., "A Fully Integrated CMOS RF Transmitter for UHF Mobile RFID Reader Applications", Proceedings of the 37$^{th}$ European Microwave Conference, Oct. 2007, pp. 1648-1651.

* cited by examiner

*Primary Examiner* — Tuan Pham
(74) *Attorney, Agent, or Firm* — Allen, Dyer, Doppelt, Milbrath & Gilchrist, P.A.

(57) ABSTRACT

The disclosure relates to an electronic differential amplification device integrated on a semiconductor chip. The device may include first and second transistors having respective source terminals connected to a first potential, and drain terminals to receive a first differential current signal. The device may include third and fourth transistors having respective source terminals connected to the first potential, and drain terminals to provide a second differential current signal to a load obtained by amplifying the first signal. The third and fourth transistors may have a respective gate terminal connected to the drain terminal of the first and the second transistors, respectively, in order to form current mirrors with the latter. The device is characterized in that the first and second transistors may have the respective gate terminals electrically connected to a common terminal, and at least one first and at least one second resistive elements are connected between the common terminal and the drain terminals of the first and the second transistors, respectively.

21 Claims, 4 Drawing Sheets

ELECTRONIC AMPLIFICATION DEVICE WITH CURRENT MIRROR FOR INTEGRATED POWER AMPLIFIERS

FIELD OF THE INVENTION

The object of the present disclosure is to provide an electronic amplification device. More particularly, the disclosure relates to an amplifier device of the current mirror type, which can be used preferably in, without being limited to, the implementation of electronic power amplifiers that are integrated on semiconductor material chips.

BACKGROUND OF THE INVENTION

As it is known, in electronic devices and equipment for wireless applications, such as, for example, those used in the mobile telephone field, transmission circuit blocks or transmitters are generally included and are so configured to generate signals to be transferred on an antenna at frequencies which are characteristic of the above-mentioned applications, typically in the radio frequency (RF). Particularly, each transmitter comprises a power amplifier connected to the antenna and is so configured as to generate and transfer voltage and current signals on the same antenna, having an appropriate width for such applications, i.e. to transfer suitable powers onto the antenna.

The increasing spread of battery-powered wireless devices of the portable type imposes that such power amplifiers ensure the transfer of the used power to the antenna, while ensuring a good conversion efficiency, i.e. a good ratio of the power transferred to the antenna to the power provided by the supply, for example, 30%. The power amplifiers require, among other things, low-consumption amplification stages.

Figure 5:
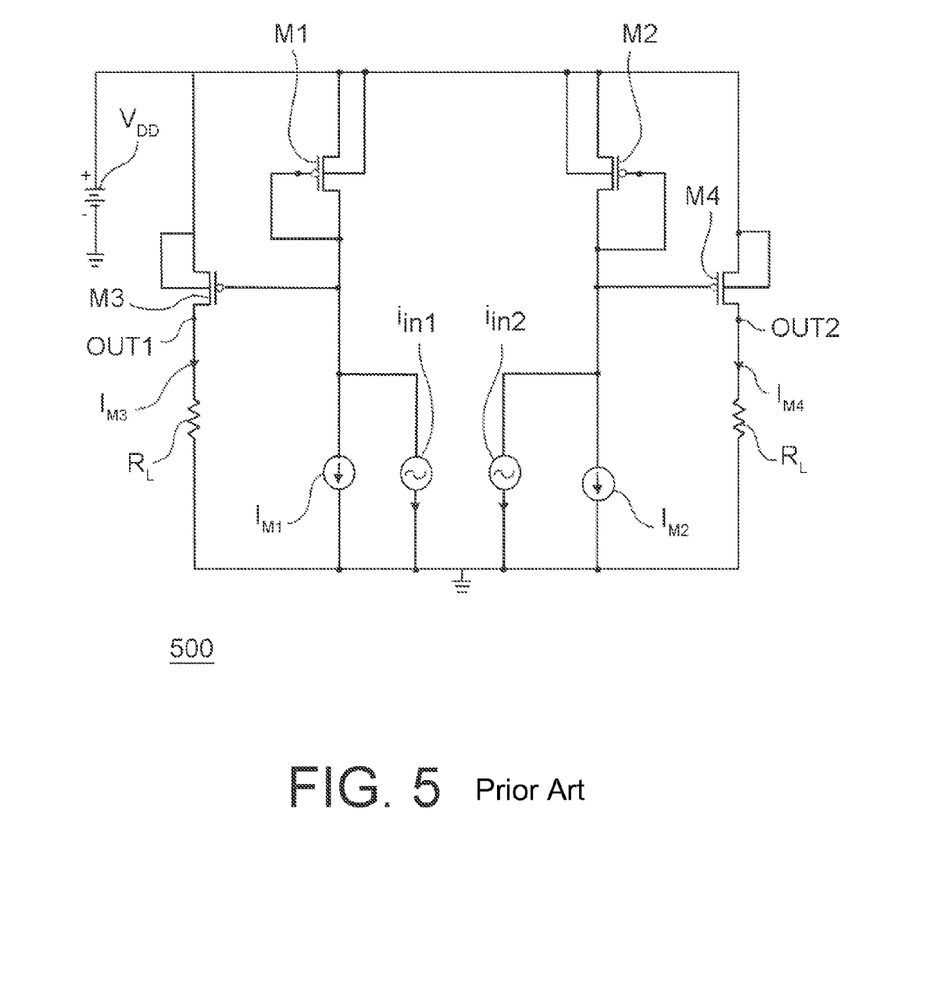
FIG. 5 schematically shows a mirror current amplifier, according to the prior art.

An example of an integrated electronic amplifier of a known type that can be used in a transmitter is schematically shown in FIG. 5. Particularly, such amplifier 500 is a differential amplifier, comprising first diode-connected PMOS transistors M1 and M2, each of which being connected to a respective second PMOS transistor M3 or M4, to establish current mirrors. The first transistors M1 and M2 are mutually equal, and the second transistors M3 and M4 are mutually equal. It may be noted, particularly, that the differential amplifier 500 is adapted to control bias currents $I_{M3,4}$ of the transistors M3 and M4, and the transfer on the load resistors $R_L$ of the differential input current signal $i_{in}=i_{in1}-i_{in2}$, where the current signals $i_{in1}$ and $i_{in2}$ are schematically represented in FIG. 5 by current generators.

In greater detail, the bias currents $I_{M1,2}$ relative to the transistors M1 and M2, and schematically illustrated by respective current generators, are reproduced on the transistors M3 and M4, approximately, based on the relationship:

$$\frac{I_{M3,4}}{I_{M1,2}} = \frac{(W/L)_{M3,4}}{(W/L)_{M1,2}} = N \tag{1a}$$

in which W and L are the width and length of the transistors M1-M4 gate channel, while N is an integer known as a "mirror factor." Based on formula 1a, the amplifier 500 allows controlling the currents in the transistors M3 and M4 thanks to the mirror. That is, once the bias currents have been set in M1 and M2, the bias currents in M3 and M4 are precisely established.

Furthermore, as it is known to those skilled in the art, the relationship in formula 1a is also valid for the signal currents. Particularly, by indicating the output differential current provided by the amplifier 500 on the loads $R_L$ with $i_{out}=i_{d3}-i_{d4}$:

$$\frac{i_{out}}{i_{in}} = \frac{i_{d3}-i_{d4}}{i_{d1}-d_{d2}} = \frac{gm_{3,4}}{gm_{1,2}} = N \tag{2a}$$

where $gm_{1,2}$ and $gm_{3,4}$ are the transconductance values of the pairs of transistors M1, M2, and M3, M4, respectively. On the basis of formula 2a, the differential input signal $i_{in}$ of the amplifier 500 is amplified by an amount which is substantially equal to the mirror factor N. In other words, the output differential current $i_{out}$ on the output transistors M3 and M4 is amplified by the factor N.

It may be noted that, in order to ensure an amplification increase of the current signal $i_{in}$, the mirror amplifier 500 requires an increase of the above-mentioned mirror factor N. However, this has the drawback of an increase in the bias currents $I_{M3,4}$ of transistors M3 and M4 based on formula 1a, i.e. an increase of the static dissipation of such amplifier 500, which may be unacceptable for most applications of battery-powered portable electronic devices.

SUMMARY OF THE INVENTION

The object of the present disclosure is to provide an electronic amplification device for use in the implementation of integrated power amplifiers, which may allow for at least partially overcoming the drawbacks set forth above with reference to the amplifiers of a known type.

A differential amplifier integrated circuit (IC) comprises first and second transistors having respective first conduction terminals to be coupled to a first reference voltage, and second conduction terminals to receive a first differential current signal to be amplified. The differential amplifier integrated circuit (IC) also comprises third and fourth transistors having respective first conduction terminals to be coupled to the first reference voltage and second conduction terminals to provide a second amplified differential current signal to a load. The third and fourth transistors each have a control terminal to be respectively coupled to the second conduction terminals of the first and second transistors to form current mirrors. The first and second transistors each have respective control terminals to be coupled to a common terminal. The differential amplifier integrated circuit includes at least one first resistive element and at least one second resistive element to be respectively coupled between the common terminal and the second conduction terminals of the first and the second transistors.

BRIEF DESCRIPTION OF THE DRAWINGS

Further characteristics and advantages of the above-mentioned amplification device may result from the description reported below of a preferred exemplary embodiment, given by way of indicative, non-limiting example, with reference to the annexed figures, in which.

DETAILED DESCRIPTION OF THE PREFERRED EMBODIMENTS

Figure 1A:
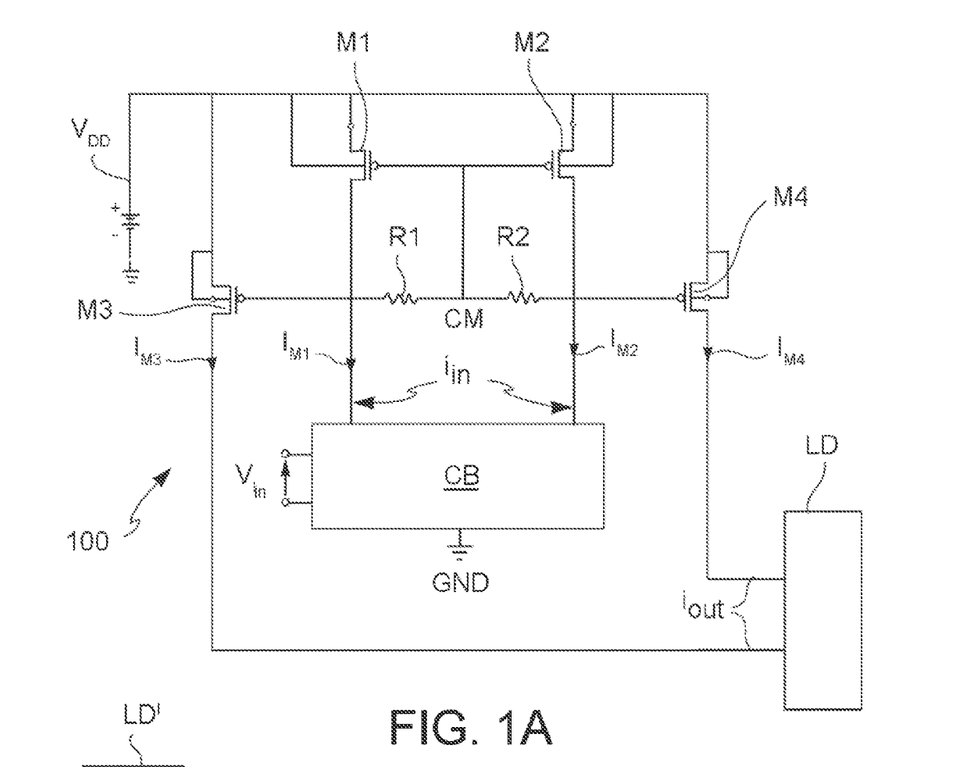
FIGS. 1A and 1B are schematic diagrams of a current mirror amplification electronic device in a PMOS and NMOS configuration, respectively, according to the present invention.
Figure 1B:
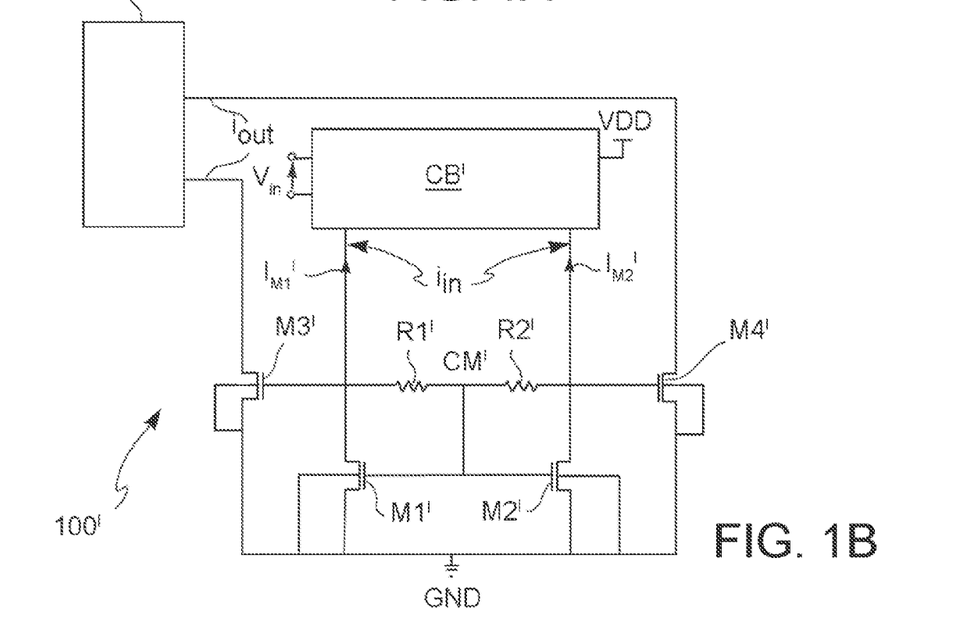

With reference to the above-mentioned FIGS. 1A and 1B, an exemplary embodiment of an innovative electronic amplification device has been indicated with 100 and 100'. Particularly, each amplification device (hereinafter simply amplifier) 100 and 100' is of the differential type, and is integrated on a semiconductor material chip. Such amplifiers 100 and 100' comprise MOS (Metal Oxide Semiconductor), PMOS, and NMOS transistors, respectively, which are electrically connected one to the other to form current mirrors in order to amplify an input current signal. It may be noted that the amplifiers 100 and 100' can also be implemented by bipolar transistors.

The amplifier 100 (or 100') is also configured to implement integrated electronic power amplifiers, which are preferably employed in the radio frequency (RF) signal transmitters of portable wireless apparatuses. Particularly, under operative conditions, each of such power amplifiers is connected to an antenna of a wireless device in order to generate and transfer voltage and current signals on the same antenna, having an appropriate width for RF applications, i.e. to apply appropriate powers on the antenna.

With reference to FIG. 1A, the current mirror amplifier 100 comprises a supply terminal connectable to a supply potential $V_{DD}$, for example, provided by a battery. Furthermore, the amplifier 100 comprises first M1 and second M2 PMOS transistors, which are mutually equal. The first M1 and second M2 transistors have the gate terminals connected one to the other and to a common electrical terminal CM. The respective source terminals of the first M1 and second M2 transistors are connected to the supply potential $V_{DD}$. Furthermore, each of the drain terminals of the first M1 and second M2 transistors is connected to the above-mentioned common terminal CM through at least one first R1 and at least one second R2 resistive elements, respectively. Such resistive elements are implemented, for example, in first R1 and second R2 integrated resistors (for example, polysilicon resistors, well resistors, or epitaxial layer resistors). Alternatively, such resistive elements R1, R2 may comprise transistors that are so biased as to operate in the ohmic region.

Furthermore, the drain terminals of the above-mentioned first M1 and second M2 transistors are connected to a circuit block CB, that is so configured as to convert a voltage differential signal $v_{in}$ applied to an input of the amplifier 100 into a respective differential current signal $i_{in}$ to be amplified, that is applied between the drain terminals of the first M1 and second M2 transistors. Such block CB conversion circuit comprises a transconductor device which is implemented, for example, through a differential or pseudo-differential stage comprising NMOS transistors, or through a differential stage driving a NMOS Gilbert cell to perform the function of a frequency translation (mixer of up-conversion). It may be noted that the circuit block CB is further connected to a ground terminal connectable to a ground potential GND.

In addition, the current mirror differential amplifier 100 comprises third M3 and fourth M4 PMOS transistors which are mutually equal. The third M3 and fourth M4 transistors have the respective source terminals connected to the supply potential $V_{DD}$, and the respective gate terminals connected to the drain terminals of the first M1 and the second M2 transistors, respectively. Such third M3 and fourth M4 transistors form the current mirror with the above-indicated first M1 and second M2 transistors. The drain terminals of the above-mentioned third M3 and fourth M4 transistors are connected to a load circuit block LD. Implementation examples of such a load circuit block LD may be described in more detail herein below.

With reference to FIG. 1B, the current mirror amplifier 100' comprises first M1'and second M2' NMOS transistors, which are mutually equal. The first M1' and second M2' transistors have the gate terminals connected one to the other and to a respective common electrical terminal CM'. The source terminals of the transistors M1' and M2' are connected to the ground potential GND. Furthermore, each of the drain terminals of the first M1' and second M2' transistors is connected to the common terminal CM' through at least one first R1' and at least one second R2' resistive elements, respectively. The resistive elements R1' and R2' are similar to the resistive elements R1, R2 reported with reference to the amplifier 100.

Furthermore, the drain terminals of the above-mentioned first M1' and second M2' transistors are connected to a respective circuit block CB' adapted to convert the voltage differential signal $v_{in}$ applied at an input of the amplifier 100' into a respective differential current signal $i_{in}$ to be amplified. The block CB' comprises a transconductor device implemented, for example, through a differential or pseudo-differential stage with PMOS transistors, or through a differential PMOS stage driving a PMOS Gilbert cell to perform the function of frequency translation (mixer of up-conversion). It may be further noted that the circuit block CB' comprises a respective connection terminal to the supply potential $V_{DD}$.

Furthermore, the current mirror differential amplifier 100' comprises a third M3'and fourth M4' NMOS transistors, which are mutually equal. The third M3' and fourth M4' transistors have the respective source terminals connected to the ground potential GND, and the respective gate terminals connected to the drain terminals of the first M1' and the second M2' transistors, respectively. The drain terminals of the above-mentioned further third M3' and fourth M4' transistors are connected to a respective load circuit block LD'.

It may be noted that the FIG. 1A (1B) discussed above schematically shows that the transistors M1-M4 (M1'-M4') are connected to the circuit blocks for conversion CB (CB') and load LD (LD'). This indicates, for example, that the load block LD (LD') comprises circuit elements that are connected to the transistors M3 and M4 (M3' and M4'). However, the load block LD (LD') may also comprise circuit elements connected also to corresponding circuit elements comprised in the conversion block CB (CB'), although such connections are not explicitly shown in FIGS. 1A and 1B. It may be further noted that the current mirror differential amplifier 100 (and 100') is configured both to control the bias currents of the transistors M1-M4 (M1'-M4') and to ensure that the differential current signal $i_{in}$ is suitably amplified.

In more detail, with reference to the amplifier 100, assuming that the first R1 and the second R2 resistances are mutually equal, i.e.:

$$R1=R2=R$$

such resistances do not affect the operative point of the transistors M1-M4 of FIG. 1A, i.e. the bias currents of the above-mentioned transistors. Indeed, under a continuous current (DC), such resistances R are passed through by null currents and, therefore, they do not induce any potential difference at the ends thereof.

Therefore, it is shown that:

$$V_{D1}=V_{G1}=V_{G2}=V_{D2}=V_{G3}=V_{G4} \quad (1)$$

i.e., under a continuous current, the potentials at the drain and gate terminals of the first M1 and second M2 transistors are all mutually equal, and are also equal to the potentials at the gate terminals of the third M3 and the fourth M4 transistors.

In such a situation, the bias currents $I_{M1}$ and $I_{M2}$ of the above-mentioned first M1 and second M2 transistors are reproduced on the drain terminals of the third M3 and the fourth M4 transistors, respectively, amplified by an N factor that is equal to the ratio between the form factors of the above-mentioned transistors M1-M4 on the basis of the relationship:

$$\frac{I_{M3,4}}{I_{M1,2}} = \frac{(W/L)_{M3,4}}{(W/L)_{M1,2}} = N. \quad (2)$$

With reference to a small signal analysis of the amplifier 100, being $i_{in}$ the input differential current of the current mirror amplifier 100, and indicating with $i_{out}$ the differential current provided to the load block LD, it may be noted that:

$$v_{G3}-v_{G4}=-Ri_{in}$$

i.e., the differential voltage that is present between the gate terminals of the third M3 and the fourth M4 transistors is proportional to the input differential current $i_{in}$. Furthermore, being the output differential current $i_{out}$ equal to:

$$i_{out}=-gm_{3,4}\cdot(v_{G3}-v_{G4})=gm_{3,4}Ri_{in}$$

the current gain $A_i$ provided by the amplifier 100 is directly proportional to the value of the above-mentioned resistance R, i.e.

$$A_i = \frac{i_{out}}{i_{in}} = gm_{3,4}\cdot R. \quad (3)$$

Completely similar considerations also apply to the amplifier 100' of FIG. 1B.

From a comparison between the relationship (3) and the relationship (2a) relative to the amplifier 500 of the known type, while keeping the bias currents and the form factors of the transistors M3 and M4 constant, by imposing the condition $R>1/gm_{1,2}$, the disclosed current mirror amplifier 100 (or 100') advantageously ensures an increase of the current gain, compared to the gains which can be obtained with the amplifiers of the known type, while keeping the static dissipation constant. Vice versa, while keeping the amplification of the current supplied by the known amplifier 500 and by the amplifier 100 (or 100') of the disclosed approach constant, by imposing $R>1/gm_{1,2}$ such amplifier 100 allows reducing the transconductance value $gm_{3,4}$ and, consequently, advantageously reducing the bias currents $I_{M3,4}$ of the third M3 and the fourth M4 transistors. In this manner, the amplifier 100 (or 100') ensures a static dissipation reduction, besides ensuring an accurate control of the bias currents of the transistors M1-M4.

Figure 2:
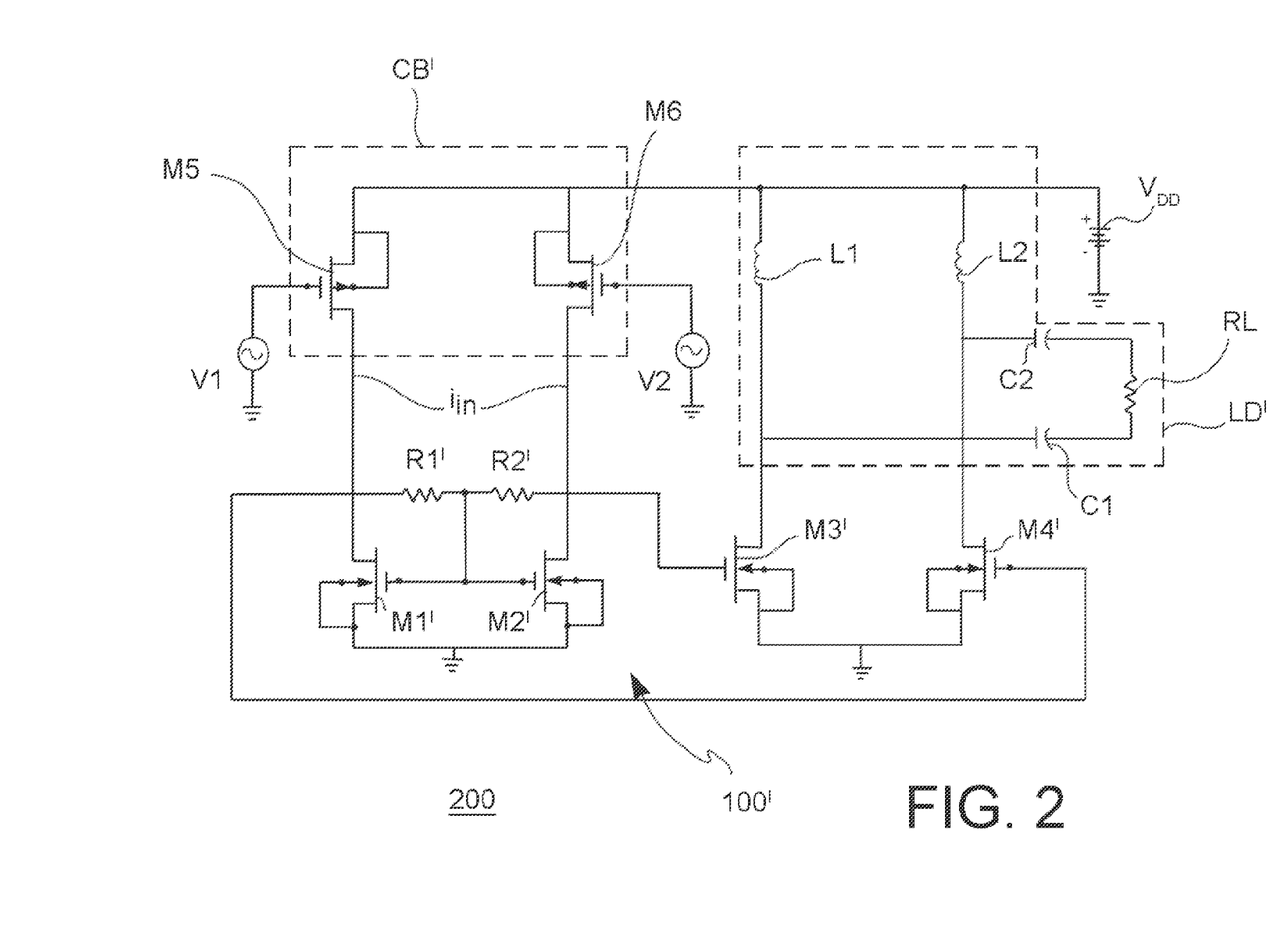
FIG. 2 is a schematic diagram of a power electronic amplifier employing the amplification device of FIG. 1B.
Figure 3:
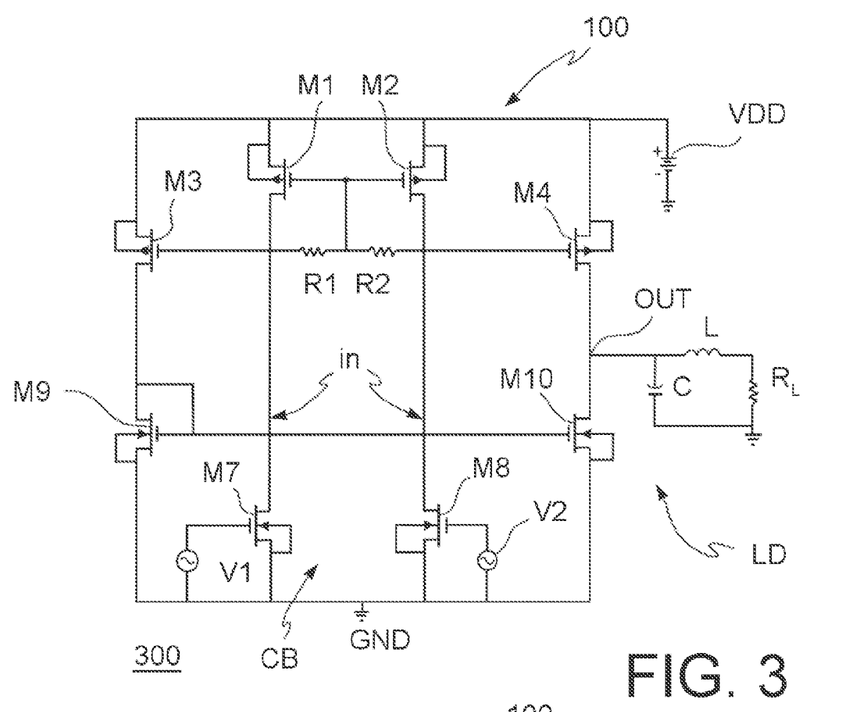
FIG. 3 is a schematic diagram of another embodiment of the power electronic amplifier employing the amplification device of FIG. 1A.
Figure 4:
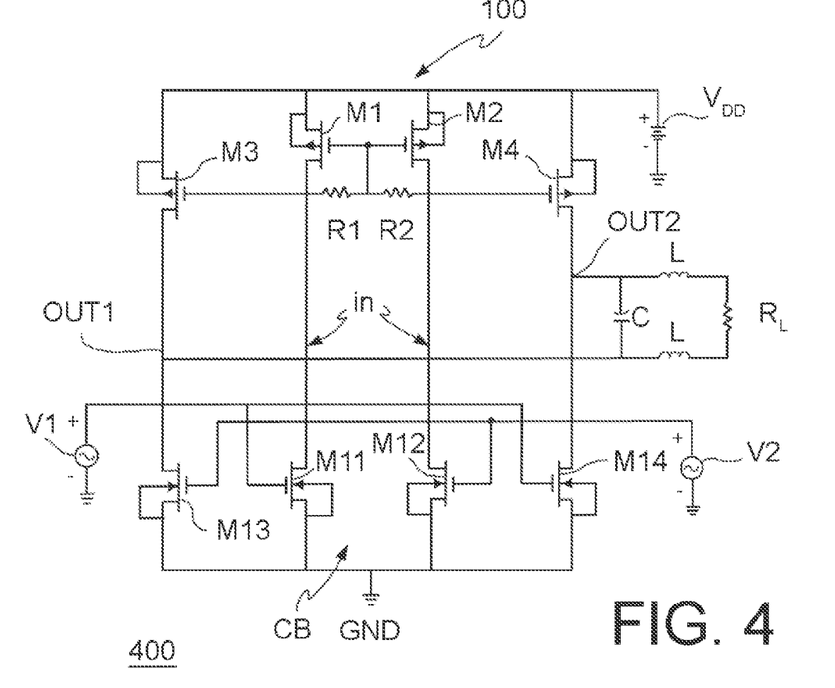
FIG. 4 is a schematic diagram of yet another embodiment of the power electronic amplifier employing the electronic amplification device of FIG. 1A.

With reference to FIGS. 2, 3, and 4, examples of electronic power amplifiers 200, 300, 400 may be described in detail, which are implemented by employing the current mirror differential amplifier 100 and 100' of FIGS. 1A and 1B. Equal or like elements to those already introduced in FIGS. 1A-B may be identified in the above-mentioned FIGS. 2, 3, and 4 by the same reference numerals.

With reference to FIG. 2, the power amplifier 200 comprises the current mirror amplifier 100' described with reference to FIG. 1B connected to the load circuit block LD'. Particularly, such circuit block LD' comprises first L1 and second L2 inductors, which are mutually equal, connected between the supply potential $V_{DD}$ and the drain terminals of the third M3' and fourth M4' transistors. Furthermore, the drain terminals of the above-mentioned third M3' and fourth M4' transistors are connected to a load resistance $R_L$ by interposition, for example, of a respective first C1 and a second C2 capacitance which are mutually equal, so as to form a load resistive element with the resistance. It may be noted that the load resistance $R_L$ is representative of the wireless equipment antenna disclosed above.

Advantageously, the first L1 and second L2 inductors are adapted to implement, besides the biasing of the above-mentioned third M3' and fourth M4' transistors, a locking or choke function of some alternate components of the currents sent to the load. In addition, the first L1 and second L2 inductors, combined with the capacitors C1 and C2, implement an impedance transformation.

The first C1 and the second C2 capacitors are adapted to implement both the choking of the continuous component of the voltage sent on the load $R_L$, and a transformation of the impedance, together with L1 and L2, in order to present a suitable impedance value to the transistors M3' and M4' drain terminals. Particularly, in the latter case, the amplifier 200 ensures an optimization of the power transfer on the load $R_L$.

Furthermore, the power amplifier 200 comprises the conversion circuit block CB' implemented through a pair of PMOS transistors M5 and M6, which implement a pseudo-differential stage adapted to convert the differential voltage input signal $v_{in}=v1-v2$ into the differential current signal $i_{in}$ applied to the current mirror amplifier 100' input.

Advantageously, it may be noted that the composition of the output stage with inductive load with the proposed current mirror amplifier 100' ensures, at the same time, both the pre-amplification of the input signal $v_{in}$ and the control of the operative current of the third M3' and fourth M4' transistors implementing the power transfer on the load $R_L$.

It may be noted that the power amplifier 200 can also be implemented by employing the PMOS amplification device 100. Furthermore, alternatively to the pseudo-differential stage M5-M6, the conversion circuit block CB' may comprise a differential stage or a differential stage driving a Gilbert cell.

With reference to FIG. 3, the power amplifier 300 comprises the current mirror differential amplifier 100 in PMOS configuration described with reference to FIG. 1A, connected to the load circuit block LD implemented through an output stage of the push-pull type in single form. Particularly, the load block LD comprises a diode-connected NMOS transistor M9 having a respective source terminal connected to the ground potential GND, and the drain terminal connected to the drain terminal of the mirror amplifier 100 third transistor M3. It may be noted that the drain current of the transistor M9 is mirrored directly on a corresponding NMOS transistor M10 having a gate terminal directly connected to the transistor M9 gate terminal. The transistor M10 is connected between the ground potential GND and an output terminal OUT of the amplifier 300, to which also the drain terminal of the amplifier 100 fourth transistor M4 is connected, in order to form the push-pull output stage. The load block LD further comprises a load circuit element comprising a resistive load $R_L$, which can be directly connected to the output terminal OUT or, alternatively, by interposition of a network LC for the impedance transformation, as shown in FIG. 3. Furthermore, the power amplifier 300 comprises the conversion circuit block CB implemented through a pair of NMOS transistors M7 and M8 implementing a pseudo-differential stage to convert the differential voltage input signal $v_{in}=v1-v2$ into the differential current signal $i_{in}$ applied to the mirror amplifier 100 input.

It may be noted that the power amplifier 300 can also be implemented as an NMOS amplifier device 100' of the present disclosure. Furthermore, alternatively to the pseudo-differential stage M7-M8, the conversion circuit block CB may comprise a differential stage or a differential stage driving a Gilbert cell.

With reference to FIG. 4, the power amplifier 400 comprises the current mirror differential amplifier 100 in PMOS configuration connected to the conversion block CB so as to form an output stage of the push-pull type in a differential from. Particularly, the above-mentioned conversion circuit block CB comprises a pair of NMOS transistors M11 and M12 implementing a pseudo-differential stage adapted to convert the differential voltage input signal $v_{in}=v1-v2$ into the differential current signal $i_{in}$ applied to the mirror amplifier 100 input.

Furthermore, such conversion block CB also comprises a NMOS transistor M13 having a respective source terminal connected to the ground potential GND, and the drain terminal connected to the drain terminal of the mirror amplifier 100 third transistor M3. Furthermore, a similar NMOS transistor M14 is connected between the ground potential GND and the drain terminal of the mirror amplifier 100 fourth transistor M4. The drain terminals of the above-mentioned transistors M13 and M14 coincide with output differential terminals OUT1 and OUT2 of the amplifier 400. In this regard, it may be noted that the transistors M13 and M14 also form a pseudo-differential stage to convert the differential voltage input signal $v_{in}=v1-v2$ into a differential current signal applied on the drain terminals of the same transistors M13 and M14. The NMOS transistors M13 and M14 concur to form two output stages of the push-pull type with the third M3 and the fourth M4 PMOS transistors.

With reference to the amplifier 400, the load block LD comprises a respective load element, which comprises a real resistive load $R_L$ which is connected directly between such output terminals OUT1 and OUT2 or, alternatively, by interposition of a network LC for the impedance transformation, as shown in FIG. 4.

It may be noted that the power amplifier 400 can also be implemented so as to comprise the NMOS amplifier device 100' of the present disclosure. Furthermore, alternatively to the pseudo-differential stage M11-M12, the conversion circuit block CB may comprise a differential stage or a differential stage driving a Gilbert cell. Advantageously, the proposed power amplifiers 200, 300, 400 employing the mirror amplification device 100, 100' may ensure a conversion efficiency typically of at least 30%.

To the embodiments of the current mirror differential amplifier described above, those of ordinary skill in the art, in order to meet contingent needs, may be able to make modifications, adaptations, and replacements of elements with other functionally equivalent ones, without departing from the scope of the following claims. Each of the characteristics described as belonging to a possible embodiment can be implemented independently from the other embodiments described.

That which is claimed:

1. A differential amplifier integrated circuit (IC) comprising:
   first and second transistors having respective first conduction terminals configured to be coupled to a first reference voltage, and second conduction terminals configured to receive a first differential current signal to be amplified;
   third and fourth transistors having respective first conduction terminals configured to be coupled to the first reference voltage and second conduction terminals configured to provide a second amplified differential current signal to a load, said third and fourth transistors each having a control terminal configured to be respectively coupled to the second conduction terminals configured of said first and second transistors to form current mirrors, said first and second transistors each having respective control terminals configured to be coupled to a common terminal; and
   at least one first resistive element and at least one second resistive element configured to be respectively coupled between the common terminal and the second conduction terminals of said first and the second transistors.

2. The differential amplifier IC according to claim 1 wherein said at least one first resistive element and at least one second resistive element each comprises at least one of a polysilicon resistor, a well resistor, and an epitaxial layer resistor.

3. The differential amplifier IC according to claim 1 wherein said at least one first resistive element and at least one second resistive element each comprises a transistor configured to be biased to operate in an ohmic region.

4. The differential amplifier IC according to claim 1 wherein said at least one first resistive element and at least one second resistive element are mutually equal.

5. The differential amplifier IC according to claim 1 wherein while in continuous current, said at least one first resistive element and at least one second resistive element are configured to be subject to zero currents.

6. The differential amplifier IC according to claim 1 wherein a differential current gain between the second amplified differential current signal and the first differential current signal is directly proportional to a common resistance value of said at least one first resistive element and at least one second resistive element based on the relationship:

$$A_i = \frac{i_{out}}{i_{in}} = gm_{3,4} \cdot R;$$

wherein $gm_{3,4}$ is a transconductance value of said third and fourth transistors; wherein R is the common resistance value of said at least one first resistive element and at least one second resistive element; wherein $i_{out}$ is the second amplified differential current signal; and wherein $i_{in}$ is the first differential current signal.

7. A differential power amplifier comprising:
   an amplifier comprising
      first and second transistors having respective first conduction terminals configured to be coupled to a first reference voltage, and second conduction terminals configured to receive a first differential current signal to be amplified,
      third and fourth transistors having respective first conduction terminals configured to be coupled to the first reference voltage and second conduction terminals configured to provide a second amplified differential current signal to a load, said third and fourth transistors each having a control terminal configured to be respectively coupled to the second conduction terminals of said first and second transistors to form current mirrors, said first and second transistors each having respective control terminals configured to be coupled to a common terminal, and at least one first resistive element and at least one second resistive element configured to be respectively coupled between the common terminal and the second conduction terminals of said first and the second transistors;

a conversion circuit block configured to be coupled between the second conduction terminals of said first and second transistors, and a second reference voltage, said conversion circuit block configured to convert a differential voltage input signal into the first differential current signal to be amplified; and a load circuit block configured to be coupled to the second conduction terminals of said third and fourth transistors of said amplifier to receive the second amplified differential current signal.

8. The differential power amplifier according to claim 7 wherein said conversion circuit block comprises a transconductor device including a first differential stage, a pseudo-differential stage configured coupled to said first differential stage, and a second differential stage configured to drive a Gilbert cell.

9. The differential power amplifier according to claim 8 wherein said load circuit block comprises:
first and second inductors being mutually equal and configured to be respectively coupled between the second reference voltage and the second conduction terminals of said third and fourth transistors; and
a first load circuit element configured to be coupled between the second conduction terminals of said third and fourth transistors.

10. The differential power amplifier according to claim 9 wherein said first load circuit element comprises a load resistance, and first and second capacitances configured to be coupled to said load resistance.

11. The differential power amplifier according to claim 7 wherein said load circuit block comprises:
a fifth diode-coupled transistor configured to be coupled between the second reference voltage and the second conduction terminal of said third transistor;
a sixth transistor having a control terminal;
said fifth diode-coupled transistor having a control terminal configured to be coupled to the control terminal of said sixth transistor to form a current mirror;
said sixth transistor configured to be coupled between the second reference voltage and the second conduction terminal of said fourth transistor to form a push-pull output stage in single form; and
a second load circuit element configured to be coupled to the second conduction terminal of said fourth transistor.

12. The differential power amplifier according to claim 11 wherein said second load circuit element comprises a load resistance, an inductor configured to be coupled to said load resistance, and a capacitor configured to be coupled to said inductor.

13. The differential power amplifier according to claim 9 wherein said first load circuit element comprises a load resistance, an inductor configured to be coupled to said load resistance, and a capacitor configured to be coupled to said inductor.

14. The differential power amplifier according to claim 7 wherein said conversion circuit block further comprises seventh and eighth transistors configured to be coupled between the second reference voltage and the second conduction terminal of said third and fourth transistors, respectively;
wherein said seventh and eighth transistors form a differential output stage of the push-pull type with said third and fourth transistors; and wherein the second conduction terminals of said third and fourth transistors are configured to be coupled to a respective first load element.

15. A radio frequency (RF) signal transmitter for a portable wireless device comprising:
an antenna; and
a differential amplifier configured to be coupled to said antenna to transmit power through said antenna and comprising
an amplifier comprising
first and second transistors having respective first conduction terminals configured to be coupled to a first reference voltage, and second conduction terminals configured to receive a first differential current signal to be amplified,
third and fourth transistors having respective first conduction terminals configured to be coupled to the first reference voltage and second conduction terminals configured to provide a second amplified differential current signal to a load, said third and fourth transistors each having a control terminal configured to be respectively coupled to the second conduction terminals of said first and second transistors to form current mirrors, said first and second transistors each having respective control terminals configured to be coupled to a common terminal, and
at least one first resistive element and at least one second resistive element configured to be respectively coupled between the common terminal and the second conduction terminals of said first and the second transistors,
a conversion circuit block configured to be coupled between the second conduction terminals of said first and second transistors, and a second reference voltage, said conversion circuit block configured to convert a differential voltage input signal into the first differential current signal to be amplified, and
a load circuit block configured to be coupled to the second conduction terminals of said third and fourth transistors of said amplifier to receive the second amplified differential current signal.

16. The RF signal transmitter according to claim 15 wherein said conversion circuit block comprises a transconductor device including a first differential stage, a pseudo-differential stage configured to be coupled to said first differential stage, and a second differential stage configured to drive a Gilbert cell.

17. The RF signal transmitter according to claim 16 wherein said load circuit block comprises:
first and second inductors being mutually equal and configured to be respectively coupled between the second reference voltage and the second conduction terminals of said third and fourth transistors; and
a first load circuit element configured to be coupled between the second conduction terminals of said third and fourth transistors.

18. A method of making a differential amplifier integrated circuit (IC) comprising:
- coupling respective first conduction terminals of first and second transistors to be coupled to a first reference voltage, and coupling second conduction terminals of the first and second transistors to receive a first differential current signal to be amplified;
- coupling first conduction terminals of third and fourth transistors to be coupled to the first reference voltage and coupling second conduction terminals of the third and fourth transistors to provide a second amplified differential current signal to a load;
- coupling respectively each control terminal of the third and fourth transistors to be coupled to the second conduction terminals of the first and second transistors to form current mirrors;
- coupling each control terminal of the first and second transistors to be coupled to a common terminal; and
- coupling at least one first resistive element and at least one second resistive element respectively to be coupled between the common terminal and the second conduction terminals of the first and the second transistors.

19. The method according to claim 18 wherein the at least one first resistive element and at least one second resistive element each comprises at least one of a polysilicon resistor, a well resistor, and an epitaxial layer resistor.

20. The method according to claim 18 wherein the at least one first resistive element and at least one second resistive element each comprises a transistor biased to operate in an ohmic region.

21. The method according to claim 18 wherein the at least one first resistive element and at least one second resistive element are mutually equal.

* * * * *